United States Patent
Fukumoto et al.

(10) Patent No.: US 7,907,472 B2
(45) Date of Patent: Mar. 15, 2011

(54) SEMICONDUCTOR INTEGRATED CIRCUIT FOR FETCHING READ DATA FROM A DDR-SDRAM OPERATING IN SYNCHRONIZATION WITH A CLOCK

(75) Inventors: Satoshi Fukumoto, Osaka (JP); Toshiya Kogishi, Kyoto (JP)

(73) Assignee: Panasonic Corporation, Osaka (JP)

( * ) Notice: Subject to any disclaimer, the term of this patent is extended or adjusted under 35 U.S.C. 154(b) by 207 days.

(21) Appl. No.: 12/302,450

(22) PCT Filed: Aug. 24, 2007

(86) PCT No.: PCT/JP2007/066452
§ 371 (c)(1),
(2), (4) Date: Nov. 25, 2008

(87) PCT Pub. No.: WO2008/023793
PCT Pub. Date: Feb. 28, 2008

(65) Prior Publication Data
US 2009/0154266 A1    Jun. 18, 2009

(30) Foreign Application Priority Data

Aug. 24, 2006 (JP) ................. 2006-227482

(51) Int. Cl.
*G11C 8/00* (2006.01)
(52) U.S. Cl. ................ 365/233.13; 365/193; 365/233.1; 365/233.17; 365/236
(58) Field of Classification Search .................. 365/193, 365/233.1, 233.13, 233.17, 236
See application file for complete search history.

(56) References Cited

U.S. PATENT DOCUMENTS

| 5,828,871 | A | 10/1998 | Kawaguchi et al. |
| 6,397,312 | B1 | 5/2002 | Nakano et al. |
| 6,529,424 | B2 | 3/2003 | Koutsoures |
| 6,768,691 | B2 | 7/2004 | Kumazaki et al. |
| 6,807,125 | B2 * | 10/2004 | Coteus et al. ............... 365/233.1 |
| 7,089,509 | B2 | 8/2006 | Emberling et al. |
| 7,467,317 | B2 * | 12/2008 | Matsui ......................... 713/401 |
| 7,688,672 | B2 * | 3/2010 | Best et al. ................... 365/233.1 |
| 2004/0120442 | A1 | 6/2004 | Emberling |
| 2004/0189360 | A1 | 9/2004 | Sekiguchi et al. |
| 2005/0047192 | A1 | 3/2005 | Matsui et al. |
| 2006/0007261 | A1 * | 1/2006 | Silverbrook .................... 347/19 |
| 2006/0140045 | A1 | 6/2006 | Kishimoto et al. |
| 2006/0262586 | A1 * | 11/2006 | Solomon et al. ................ 365/63 |

FOREIGN PATENT DOCUMENTS

JP    8-221315    8/1996
(Continued)

*Primary Examiner* — Hoai V Ho
(74) *Attorney, Agent, or Firm* — McDermott Will & Emery LLP

(57) ABSTRACT

A semiconductor integrated circuit (100) fetches read data from DDR-SDRAMs (110, 120) each operating in synchronization with a clock, and transfers the read data. The semiconductor integrated circuit (100) includes read buffers (104, 105) for fetching the read data from the DDR-SDRAMs (110, 120), and transferring the read data, latch timing control circuits (102, 103) for controlling respective latch timings with which the read buffers (104, 105) fetch the read data from the DDR-SDRAMs (110, 120) based on respective data strobe signals from the DDR-SDRAMs (110, 120), and a read timing control circuit (106) for controlling respective read timings with which the read buffers (104, 105) transfer the read data based on the latch timings of the latch timing control circuits (102, 103).

6 Claims, 6 Drawing Sheets

FOREIGN PATENT DOCUMENTS

| JP | 11-025029 | 1/1999 |
| JP | 2000-207349 | 7/2000 |
| JP | 2004-185608 | 7/2004 |
| JP | 2006-048226 | 2/2006 |
| JP | 2006-065470 | 3/2006 |
| JP | 2006-189916 | 7/2006 |

* cited by examiner

SEMICONDUCTOR INTEGRATED CIRCUIT FOR FETCHING READ DATA FROM A DDR-SDRAM OPERATING IN SYNCHRONIZATION WITH A CLOCK

RELATED APPLICATIONS

This application is the U.S. National Phase under 35 U.S.C. §371 of International Application No. PCT/JP2007/066452, filed on Aug. 24, 2007, which in turn claims the benefit of Japanese Application No. 2006-227482, filed on Aug. 24, 2006, the disclosures of which Applications are incorporated by reference herein.

TECHNICAL FIELD

The present invention relates to a semiconductor integrated circuit having a memory controller to which a double-data-rate-type synchronous dynamic random access memory (DDR-SDRAM) is connected.

BACKGROUND ART

At present, SDRAMs (Synchronous DRAMs) which are DRAMs (Dynamic Random Access Memories) each operating in synchronization with a clock are used in numerous memory systems. Particularly in recent years, a DDR-SDRAM (Double Date Rate SDRAM) which is a SDRAM having a high-speed data transfer function has received attention. Since the DDR-SDRAM performs data transfer in synchronization with both of a rising edge and a falling edge of a clock, fast data transfer at a speed double the data transfer speed of a conventional SDRAM is possible.

A memory controller in a memory system including a DDR-SDRAM fetches read data from the DDR-SDRAM on a byte-by-byte basis based on the timing of a data strobe signal (DQS) outputted for each set of 1-byte data. For example, when a 32-bit system bus is used, four sets of read data fetched on a byte-by-byte basis are collectively outputted to the outside of the memory system.

When fetching read data from the DDR-SDRAM, in order to normally latch the read data by matching the phases of the DQS and the read data, it is necessary to connect the memory controller and the DDR-SDRAM by effecting equal-length wiring of a data strobe signal line and a data signal line such that a signal arrival time of the DQS from the DDR-SDRAM till it arrives at the memory controller is equal to a signal arrival time of the read data from the DDR-SDRAM till it arrives at the memory controller.

As a technology for equalizing signal arrival times as mentioned above, there has been conventionally known a technology as described in, e.g., Patent Document 1, which provides a delay circuit between a DDR-SDRAM and a semiconductor integrated circuit for controlling the DDR-SDRAM, and adjusts the delay time of a clock and the delay time of a DQS with an access from a CPU provided outside a memory system.

A description will be given hereinbelow to a prior-art technology related to the adjustment of signal arrival times in such a conventional memory system.

FIG. 6 is a block diagram of a principal structure of the conventional memory system. In the drawings, the conventional memory system includes a semiconductor integrated circuit 1 for controlling DDR-SDRAMs, a clock generation circuit 2, the two DDR-SDRAMs 3 and 4, and delay circuits 5, 6, 7, and 8 for delaying signals. In the memory system mentioned above, the delay time of a clock supplied to the DDR-SDRAMs 3 and 4, and the respective delay times of data strobe signals DQS[0] and DQS[1] propagating between the foregoing semiconductor integrated circuit 1 and the foregoing DDR-SDRAMs 3 and 4 are adjusted with an access from a CPU provided outside the memory system. By adjusting the delay times between the data strobe signals DQS[0] and DQS[1] and read data DQ[7:0] and DQ[15:8], the memory system matches the phases of the data strobe signals DQS[0] and DQS[1] and the read data DQ[7:0] and DQ[15:8] which are supplied from the foregoing DDR-SDRAMs 3 and 4 to the semiconductor integrated circuit 1, and smoothly fetches the read data DQ[7:0] and DQ[15:8].

Patent Document 1: Japanese Laid-Open Patent Publication No. H 11-25029

DISCLOSURE OF THE INVENTION

Problems to be Solved by the Invention

However, in the foregoing conventional memory system, the delay circuits 5 to 8 are provided outside the semiconductor integrated circuit 1, so that the design of the memory system becomes complicated. In addition, because it is necessary to preset the delay times in the foregoing delay circuits 5 to 8, it is necessary to provide the delay times with margins in order to cope with a delay due to a voltage variation or a temperature change during the operation of the memory system.

The present invention has been achieved by focusing attention on the foregoing problems, and an object thereof is to implement, with a simple structure, a semiconductor integrated circuit which allows high-speed fetching of read data from a DDR-SDRAM.

Means for Solving the Problems

A first embodiment of the present invention is a semiconductor integrated circuit for fetching read data from at least one DDR-SDRAM operating in synchronization with a clock, and transferring the read data, the semiconductor integrated circuit including: at least one read buffer each for fetching read data from each said at least one DDR-SDRAM, and transferring the read data; at least one latch timing control circuit each for controlling a latch timing with which each of said at least one read buffer fetches the read data from the DDR-SDRAM based on a data strobe signal from the DDR-SDRAM; and a read timing control circuit for controlling a read timing with which each of said at least read buffer transfers the read data based on the latch timing of the corresponding latch timing control circuit.

In the arrangement, the data strobe signal from the DDR-SDRAM is supplied to the latch timing control circuit in the semiconductor integrated circuit, and the latch timing with which the read buffer fetches and latches the read data is controlled by the latch timing control circuit. As a result, it is no more necessary to provide a delay circuit outside the semiconductor integrated circuit.

Because the latch timing control circuit controls the latch timing, it is no more necessary to provide the semiconductor integrated circuit with a margin of a delay time for coping with a delay due to a voltage variation or a temperature change during the operation of the semiconductor integrated circuit.

EFFECT OF THE INVENTION

In accordance with the present invention, it is unnecessary to provide a delay circuit outside the semiconductor integrated circuit. As a result, the mounting of a memory system on a substrate becomes simpler than the mounting of a conventional memory system, and the latch timing with which the read data is fetched to the read buffer and latched is controlled. Therefore, even when a voltage variation or a temperature change has occurred during the operation of the semiconductor integrated circuit, the read data can be fetched smoothly and reliably with no error.

DESCRIPTION OF NUMERALS

Figure 1:
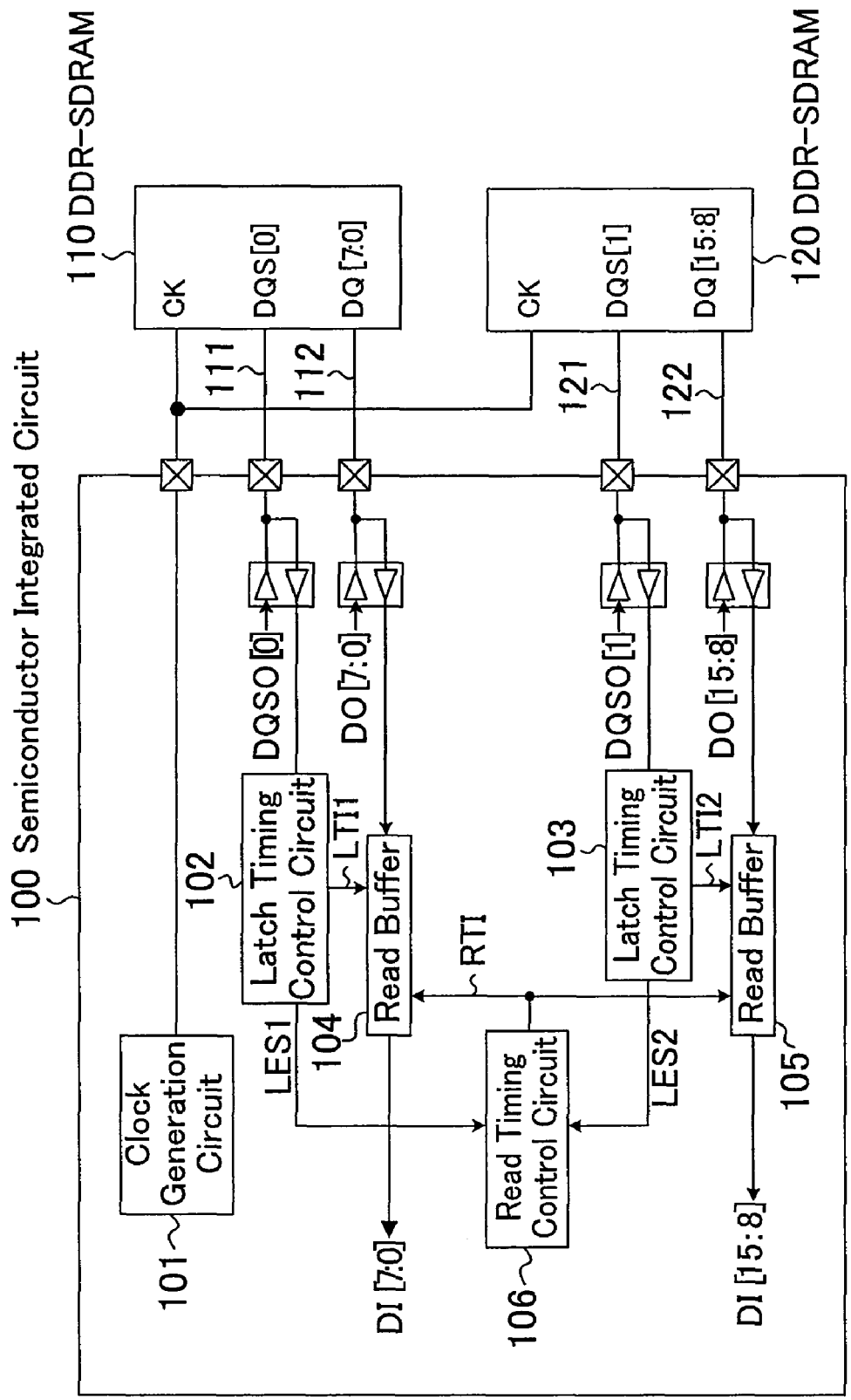
FIG. 1 is a block diagram showing a structure of a principal portion of a memory system of Embodiment 1 of the present invention.

100 Semiconductor Integrated Circuit
101 Clock Generation Circuit
102, 103 Latch Timing Control Circuits
104, 105 Read Buffers
106 Read Timing Control Circuit
110, 120, and 210 DDR-SDRAMs
111, 121 Data Strobe Signal Lines
112, 122 Data Signal Lines
201 Latch Timing Indication Circuit
202 Latch Count Circuit
203 Comparison Circuit
211, 213 Data Strobe Signal Lines
212, 214 Data Signal Lines
300 Electronic Imaging Device
301 Semiconductor Integrated Circuit
302 Lens
303 Image Sensor
304 TG
305 CDS/AGC
306 ADC
307 Display Device

BEST MODE FOR CARRYING OUT THE INVENTION

Referring to the drawings, a semiconductor integrated circuit and a memory system according to each of the embodiments of the present invention will be described hereinbelow. In the following embodiments, components having the same functions as in the other embodiments are provided with the same reference numerals, and the description thereof will be omitted.

Embodiment 1

FIG. 1 is a block diagram showing a structure of a principal portion of a memory system according to Embodiment 1 of the present invention.

In the drawing, the memory system includes a semiconductor integrated circuit 100, and two DDR-SDRAMs 110 and 120. The foregoing semiconductor integrated circuit 100 fetches read data DQ[7:0] and DQ[15:8] from the two DDR-SDRAMs 110 and 120 each operating in synchronization with a clock generated by a clock generation circuit 101, and transfers the read data. Each of the DDR-SDRAMs 110 and 120 is connected to the same clock system. The clock system is a system of a clock generated by the clock generation circuit 101.

The foregoing semiconductor integrated circuit 100 has latch timing control circuits 102 and 103, read buffers 104 and 105, and a read timing control circuit 106 which are provided in the inside thereof.

The foregoing semiconductor integrated circuit 100 is connected to the DDR-SDRAM 110 via a data strobe signal line 111 for transmitting a data strobe signal DQS[0] from the DDR-SDRAM 110, and via a data signal line 112 for transmitting the read data DQ[7:0] from the DDR-SDRAM 110. The foregoing semiconductor integrated circuit 100 is also connected to the DDR-SDRAM 120 via a data strobe signal line 121 for transmitting a data strobe signal DQS[1] from the DDR-SDRAM 120, and via a data signal line 122 for transmitting the read data DQ[15:8] from the DDR-SDRAM 120.

The read buffer 104 fetches the read data DQ[7:0] from the foregoing DDR-SDRAM 110, and transfers the read data. The read buffer 105 fetches the read data DQ[15:8] from the foregoing DDR-SDRAM 120, and transfers the read data.

The latch timing control circuit 102 controls a latch timing LTI1 with which the foregoing read buffer 104 fetches the read data DQ[7:0] from the foregoing DDR-SDRAM 110 based on the data strobe signal DQS[0] from the one DDR-SDRAM 110. The read buffer 104 fetches the read data DQ[7:0] from the foregoing DDR-SDRAM 110 based on the latch timing LTI1 of the foregoing latch timing control circuit 102.

On the other hand, the latch timing control circuit 103 controls a latch timing LTI2 with which the foregoing read buffer 105 fetches the read data DQ[15:8] from the foregoing DDR-SDRAM 120 based on the data strobe signal DQS[1] from the other DDR-SDRAM 120. The read buffer 105 fetches the read data DQ[15:8] from the foregoing DDR-SDRAM 120 based on the latch timing LTI2 of the foregoing latch timing control circuit 103.

The read timing control circuit 106 controls a read timing RTI with which the foregoing read buffers 104 and 105 transfer read data DI[7:0] and DI[15:8] in accordance with latch completion signals LES1 and LES2 generated based on the latch timings LTI1 and LTI2 from the foregoing latch timing control circuits 102 and 103. That is, the read timing control circuit 106 controls the respective read timings for the read buffers 104 and 105. The foregoing read data DI[7:0] and the foregoing read data DQ[7:0] are identical data, and the foregoing read data DI[15:8] and the foregoing read data DQ[15:8] are identical data.

The semiconductor integrated circuit 100 includes the latch timing control circuits 102 and 103, and the read buffers 104 and 105 for each of the data strobe signals DQS[0] and DQS[1], i.e., for each of the DDR-SDRAMs 110 and 120 in the present embodiment. That is, the semiconductor integrated circuit 100 includes the latch timing control circuit 102 and the read buffer 104 in correspondence to the data strobe signal DQS[0], and includes the latch timing control circuit 103 and the read buffer 105 in correspondence to the data strobe signal DQS[1]. In other words, the semiconductor integrated circuit 100 includes the latch timing control circuit 102 and the read buffer 104 in correspondence to the DDR- SDRAM 110, and includes the latch timing control circuit 103 and the read buffer 105 in correspondence to the DDR-SDRAM 120.

The foregoing read buffers 104 and 105 transfer the read data DI[7:0] and DI[15:8] based on the read timing RTI from the foregoing read timing control circuit 106.

The foregoing read timing control circuit 106 has a read timing indication circuit (not shown) in the inside thereof. With the foregoing read timing indication circuit, the read timing control circuit 106 determines that all the latch timing control circuits 102 and 103 provided in the semiconductor integrated circuit 100 have outputted the latch completion signals LES1 and LES2, and transfers the read data DI[7:0] and DI[15:8] from the respective read buffers 104 and 105 provided in the semiconductor integrated circuit 100 after the determination.

Figure 2:
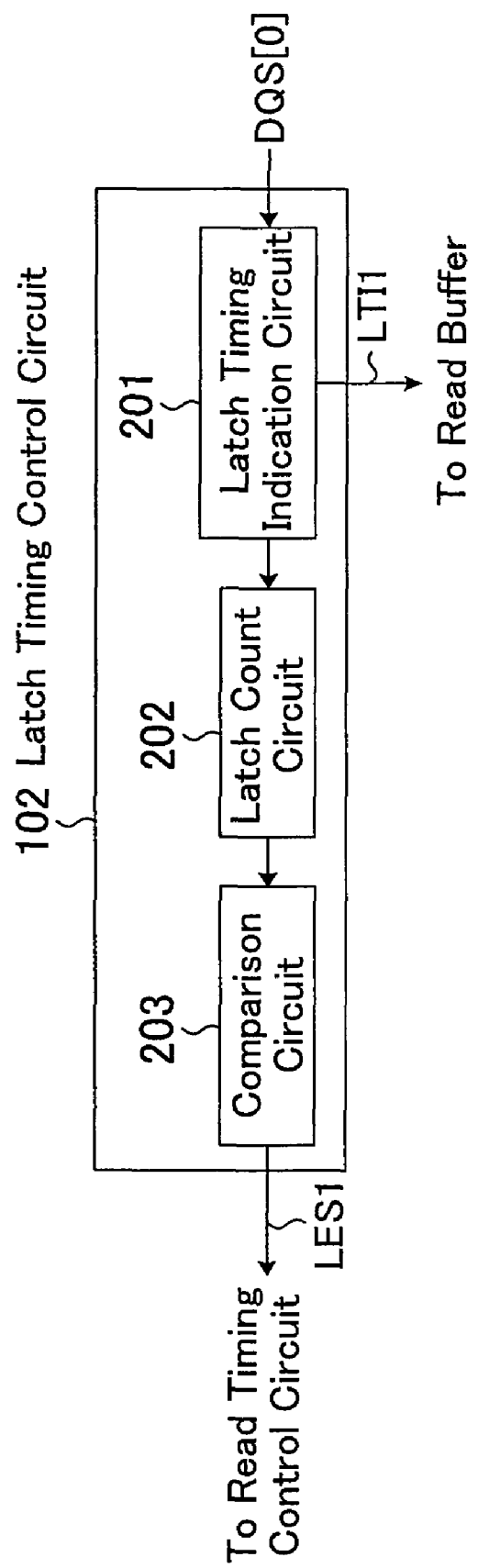
FIG. 2 is a block diagram showing an overall structure of a latch timing control circuit 102 in the semiconductor integrated circuit 100 of FIG. 1.

FIG. 2 is a block diagram of an overall structure of the latch timing control circuit 102.

In the drawing, the latch timing control circuit 102 includes a latch timing indication circuit 201 for indicating the latch timing LTI1 on each edge of the data strobe signal DQS[0], a latch count circuit 202 for counting the pieces of the read data DQ[7:0] fetched to the read buffer 104 of FIG. 1, and a comparison circuit 203 for comparing the counted number of the foregoing latch count circuit 202 with a predetermined reference value, and generating the latch completion signal LES1 when the foregoing counted number reaches the foregoing predetermined reference value. The predetermined reference value of the foregoing comparison circuit is a fixed value of not less than a value "1", and is, e.g., a value "2".

In the inside of the latch timing control circuit 103 also, a latch timing indication circuit, a latch count circuit, and a comparison circuit are provided as described above.

Figure 3:
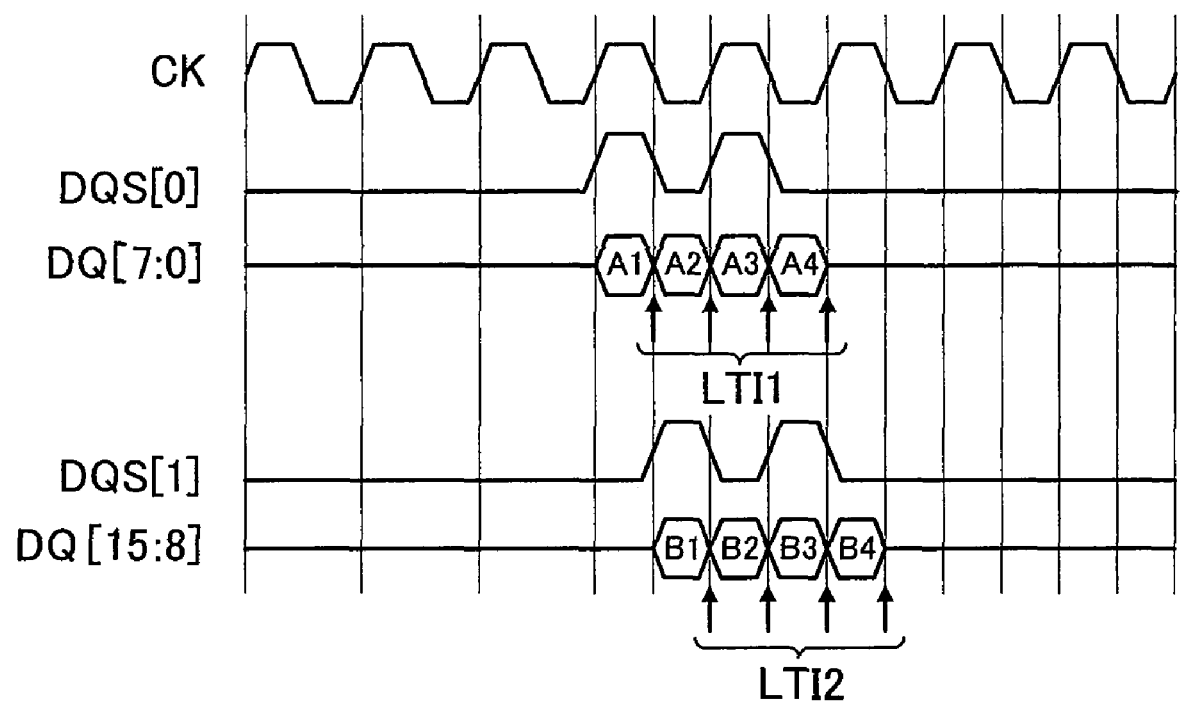
FIG. 3 is a schematic diagram showing a read timing in the semiconductor integrated circuit 100 of FIG. 1.

FIG. 3 is a schematic diagram showing a latch timing in the semiconductor integrated circuit 100 of the present embodiment.

As shown in the drawing, the latch timing indication circuit 201 provided in each of the latch timing control circuits 102 and 103 of the present embodiment indicates the latch timings LTI1 and LTI2 on each edge of the data strobe signals DQS[0] and DQS[1]. The read buffer 104 fetches the read data DQ[7:0] on a byte-by-byte basis (A1, A2, A3, and A4) based on the latch timing LTI1 from the foregoing latch timing control circuit 102. The read buffer 105 fetches the read data DQ[15:8] on a byte-by-byte basis (B1, B2, B3, and B4) based on the latch timing LTI2 from the foregoing latch timing control circuit 103. At this time, since the foregoing latch timings LTI1 and LTI2 are indicated on each edge of each of the data strobe signals DQS[0] and DQS[1], the statuses of the data buffers are monitored on each edge of the data strobe signals DQS[0] and DQS[1], and the foregoing read data A1 to A4, and B1 to B4 is fetched by the respective read buffers 104 and 105 at the time when each byte of read data A1 to A4, and B1 to B4 are obtained.

Thus, in the present embodiment, it is unnecessary to provide a delay circuit outside the semiconductor integrated circuit 100. Accordingly, the mounting of the memory system on a substrate becomes simpler than the mounting of a conventional memory system. In addition, because latch timings LT1 and LT2 with which the read data DQ[7:0] and DQ[15:8] are fetched and latched are controlled, the read data DQ[7:0] and DQ[15:8] can be smoothly fetched.

Moreover, since the latch timing indication circuit 201 indicates the latch timing on each edge of each of the data strobe signals DQS, and the read buffers 104 and 105 perform fetching at the time when each byte of read data A1 to A4, and B1 to B4 are obtained, it is possible to achieve an improvement in memory access speed, and drive the plurality of DDR-SDRAMs with the same clock system.

Although the memory system including the two DDR-SDRAMs is shown in FIG. 1, the memory system of the present embodiment may also be implemented with a structure in which three or more DDR-SDRAMs are connected to the semiconductor integrated circuit 100. In that case, it is possible to initiate fetching to the read buffers by monitoring the statuses of the data buffers for the read data on each edge of the data strobe signal from each of the DDR-SDRAMs.

Among the lines between the semiconductor integrated circuit 100 and each of the DDR-SDRAMs 110 and 120, it is sufficient that only the data strobe signal lines are wired to have equal lengths, and there is no need to consider the equal-length wiring of the other lines such as the data signal lines. This allows a reduction in restrictions on mounting, and easier mounting than conventional mounting.

In the present embodiment, it is possible to connect one DDR-SDRAM to the semiconductor integrated circuit 100.

Although the predetermined reference value of the foregoing comparison circuit 203 has been set to the value "2", it is also possible to provide a structure in which the predetermined reference value can be set by a CPU (not shown) outside the semiconductor integrated circuit 100 of FIG. 1, and adjust a delay time during the execution of a program.

Embodiment 2

Figure 4:
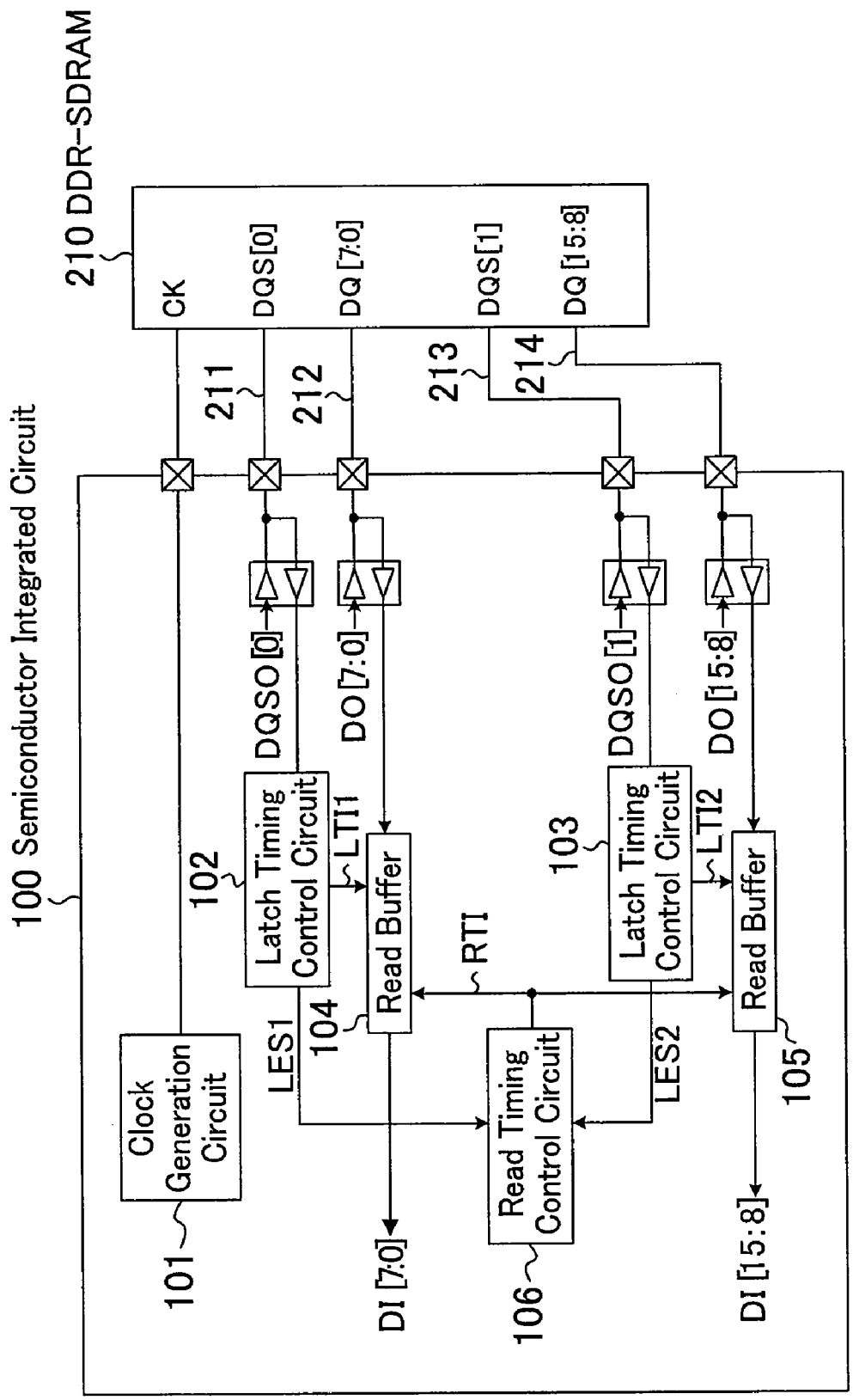
FIG. 4 is a block diagram showing a structure of a principal portion of a memory system of Embodiment 2 of the present invention.
Figure 5:
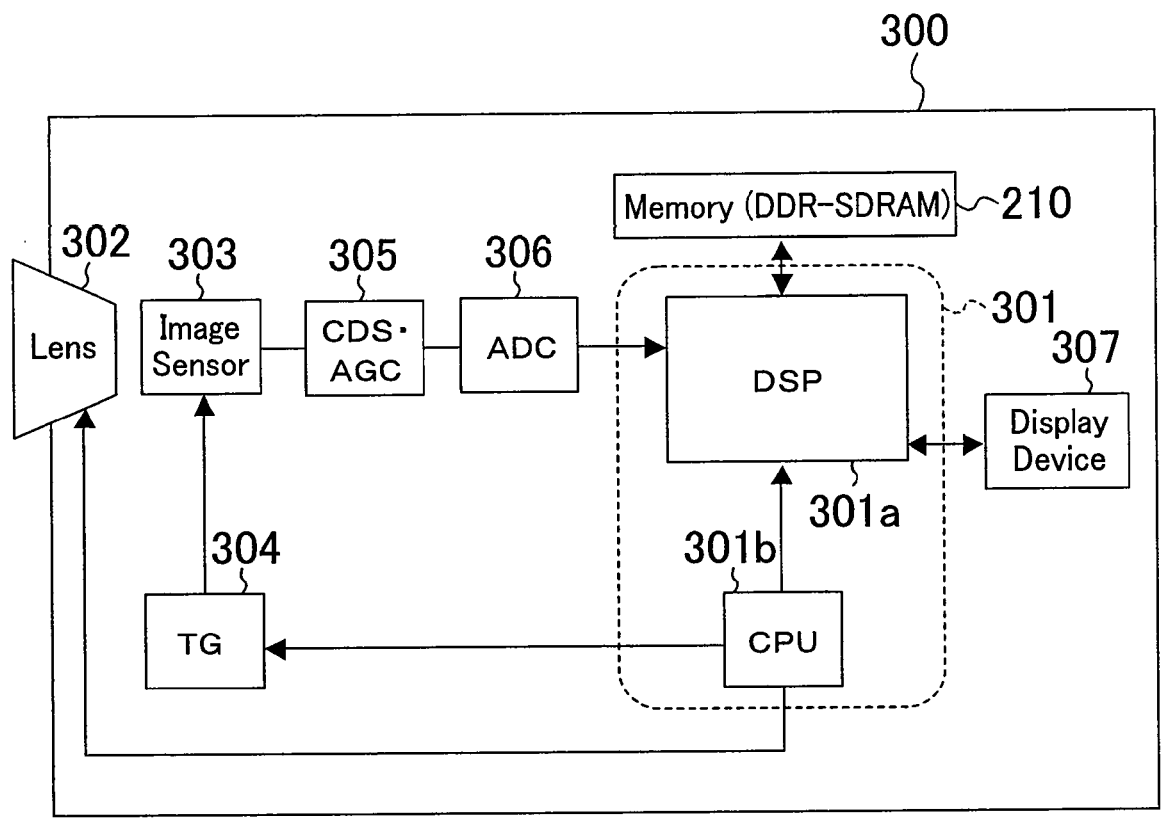
FIG. 5 is a block diagram showing a structure of a principal portion of an electronic imaging device 300 of Embodiment 3 of the present invention.
Figure 6:
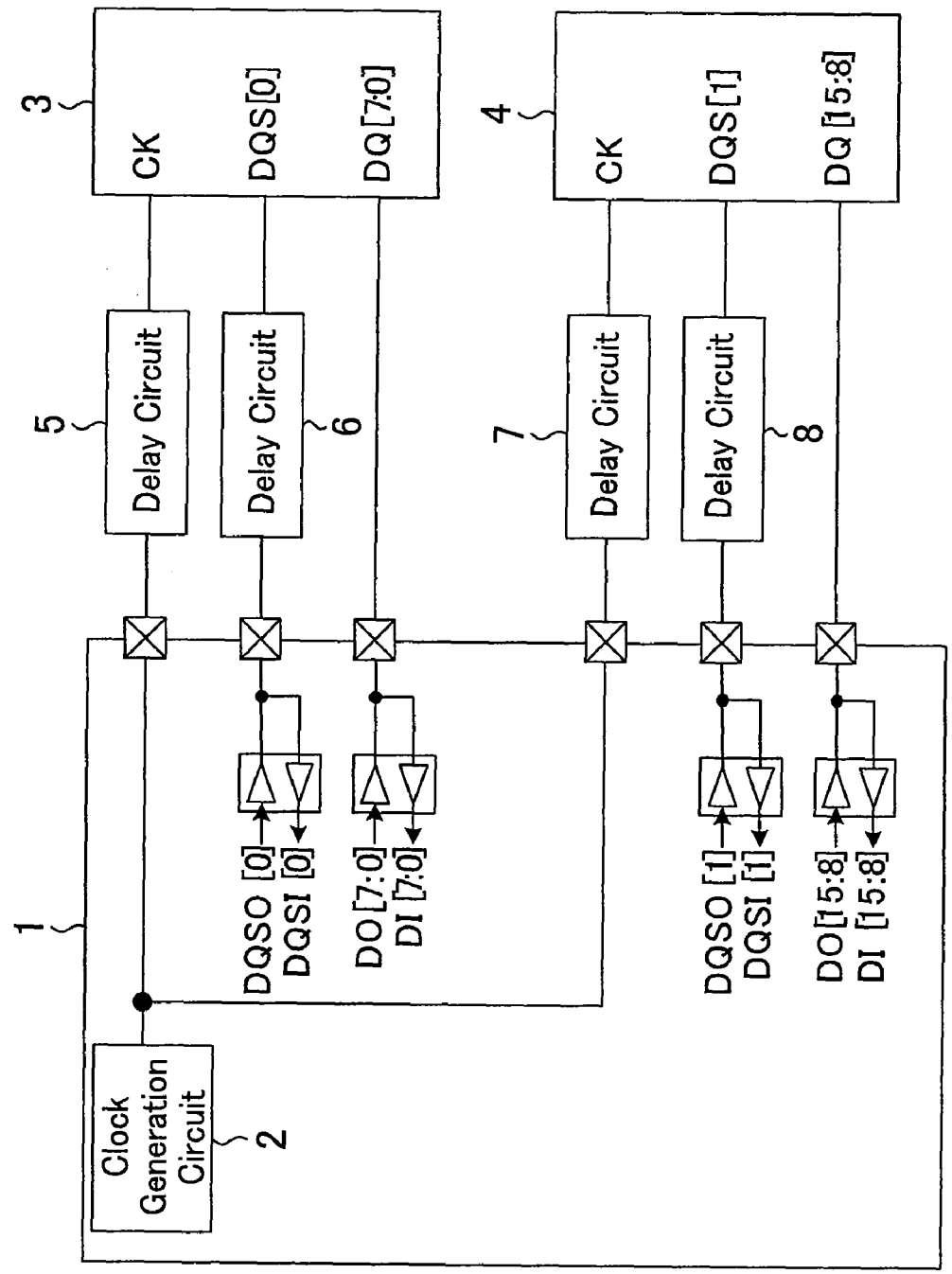
FIG. 6 is a block diagram showing a structure of a principal portion of a conventional memory system.

FIG. 4 is a block diagram showing a structure of a principal portion of a memory system of Embodiment 2 of the present invention.

As shown in the drawing, the memory system of the present embodiment is different from the memory system of Embodiment 1 in that, instead of the two DDR-SDRAMs 110 and 120, one DDR-SDRAM 210 is connected. The DDR-SDRAM 210 is connected to the semiconductor integrated circuit 100 via a plurality of data strobe signal lines.

The DDR-SDRAM 210 outputs the two data strobe signals DQS[0] and DQS[1]. The semiconductor integrated circuit 100 fetches the read data DQ[7:0] and DQ[15:8] from the DDR-SDRAM 210, and transfers the read data. The bits of the read data DQ[7:0] and DQ[15:8] are signals each in synchronization with the clock generated by the clock generation circuit 101.

The semiconductor integrated circuit 100 is connected to the DDR-SDRAM 210 via a data strobe signal line 211 for transmitting the data strobe signal DQS[0], via a data signal line 212 for transmitting the read data DQ[7:0] corresponding to the data strobe signal DQS[0], via a data strobe signal line 213 for transmitting the data strobe signal DQS[1], and via a data signal line 214 for transmitting the read data DQ[15:8] corresponding to the data strobe signal DQS[1].

The semiconductor integrated circuit 100 includes the latch timing control circuits 102 and 103, and the read buffers 104 and 105 for each of the data strobe signals DQS[0] and DQS[1] from the one DDR-SDRAM 210. That is, the semiconductor integrated circuit 100 includes the latch timing control circuit 102 and the read buffer 104 in correspondence to the data strobe signal DQS[0], and includes the latch timing control circuit 103 and the read buffer 105 in correspondence to the data strobe signal DQS[1].

Although the memory system including the one DDR-SDRAM having the plurality of data strobe signals is shown in FIG. 4, the memory system of the present embodiment may also be implemented with a structure in which a plurality of DDR-SDRAMs having a plurality of data strobe signals are connected to the semiconductor integrated circuit 100. In that case, it is possible to initiate fetching to the read buffers by monitoring the statuses of the data buffers for the read data on each edge of the data strobe signal of each of the DDR-SDRAMs.

Among the lines between the semiconductor integrated circuit 100 and the DDR-SDRAM 210, it is sufficient that only the data strobe signal lines are wired to have equal lengths, and there is no need to consider the equal-length wiring of the other lines such as the data signal lines. This allows a reduction in restrictions on mounting, and easier mounting than conventional mounting.

Embodiment 3

An electronic imaging device 300 of Embodiment 3 of the present invention includes a semiconductor integrated circuit 301, the DDR-SDRAM 210 operating in synchronization with a clock, a lens 302, an image sensor 303, a TG (Timing Generator) 304, a CDS/AGC (Correlated Double Sampling, Automatic Gain Control) 305, an ADC (Analog to Digital Converter) 306, and a display device 307. The semiconductor integrated circuit 301 includes the semiconductor integrated circuit 100, and has a DSP (Digital Signal Processor) 301a, and a CPU (Central Processing Unit) 301b each mounted thereon.

Instead of the DDR-SDRAM 210, the DDR-SDRAM 110 and the DDR-SDRAM 120 may also be provided in the electronic imaging device 300. Like in the DDR-SDRAMs 110 and 120, three or more DDR-SDRAMs each outputting one data strobe signal may be provided. Otherwise, a DDR-SDRAM outputting one data strobe signal, and a DDR-SDRAM outputting two or more data strobe signals may be both provided.

Alternatively, the electronic imaging device 300 may also include a plurality of the lenses 302, and a plurality of the image sensors 303.

INDUSTRIAL APPLICABILITY

As described above, the present invention implements, with a simple structure, reliable high-speed fetching of the read data from the DDR-SDRAM without providing a delay circuit outside the semiconductor integrated circuit. Therefore, the present invention is particularly useful as a semiconductor integrated circuit which fetches read data from a DDR-SDRAM operating in synchronization with a clock or the like.

The invention claimed is:

1. A semiconductor integrated circuit for fetching read data from DDR-SDRAMs operating in synchronization with a clock, and transferring the read data, the semiconductor integrated circuit comprising:
read buffers each of which is coupled to a corresponding one of data strobe signals from a corresponding one of the DDR-SDRAMs, and configured to fetch read data from the corresponding one of the DDR-SDRAMs and to transfer the read data;
latch timing control circuits each of which is coupled to the corresponding one of data strobe signals from the corresponding one of the DDR-SDRAMs, and configured to control a latch timing with which each read buffer fetches the read data from the corresponding one of the DDR-SDRAMs based on the corresponding one of the data strobe signals from the corresponding one of the DDR-SDRAMs; and
a read timing control circuit for controlling a read timing with which each read buffer transfers the read data based on the latch timing of the corresponding latch timing control circuit, wherein:
each latch timing control circuit and each read buffer are coupled to the corresponding one of the data strobe signals from the corresponding one of the DDR-SDRAMs, and
the read timing control circuit controls the respective read timings for the read buffers.

2. The semiconductor integrated circuit of claim 1, wherein:
the semiconductor integrated circuit fetches read data from the DDR-SDRAMs connected to the same clock system, and transfers the read data, and
the semiconductor integrated circuit is connected to the DDR-SDRAMs via data strobe signal lines for transmitting the respective data strobe signals from the respective DDR-SDRAMs, and via data signal lines each of which is configured to transmit the read data from the respective DDR-SDRAMs.

3. A semiconductor integrated circuit for fetching read data from at least one DDR-SDRAM operating in synchronization with a clock, and transferring the read data, the semiconductor integrated circuit comprising:
at least one read buffer which is coupled to a corresponding data strobe signal from said at least one DDR-SDRAM to fetch read data from said at least one DDR-SDRAM, and transfer the read data;
at least one latch timing control circuit which is coupled to the corresponding data strobe signal to control a latch timing with which said at least one read buffer fetches the read data from said at least one DDR-SDRAM based on the corresponding data strobe signal from said at least one DDR-SDRAM; and
a read timing control circuit for controlling a read timing with which said at least one read buffer transfers the read data based on the latch timing of the corresponding latch timing control circuit, wherein:
said at least one latch timing control circuit comprises:
a latch timing indication circuit for indicating the latch timing on each edge of the data strobe signal;
a latch count circuit for counting pieces of the read data fetched to the read buffer; and
a comparison circuit for comparing the counted number of the latch count circuit with a predetermined reference value, and generating a latch completion signal when the counted number reaches the predetermined reference value, and
the read timing control circuit determines that said at least one latch timing control circuit provided in the semiconductor integrated circuit has outputted the latch completion signal, and transfers the read data from said at least one read buffer provided in the semiconductor integrated circuit after the determination.

4. A semiconductor integrated circuit for fetching read data from at least one DDR-SDRAM each operating in synchronization with a clock, and transferring the read data, the semiconductor integrated circuit comprising:
at least one read buffer which is coupled to said at least one DDR-SDRAM to fetch read data from said at least one DDR-SDRAM, and transfer the read data;
at least one latch timing control circuit which is coupled to said at least one DDR-SDRAM to control a latch timing with which said at least one read buffer fetches the read data from said at least one DDR-SDRAM based on a data strobe signal from said at least one DDR-SDRAM; and a read timing control circuit for controlling a read timing with which each said at least one read buffer transfers the read data based on the latch timing of the corresponding latch timing control circuit, wherein:

at least one latch timing control circuit comprises:
- a latch timing indication circuit for indicating the latch timing on each edge of the data strobe signal;
- a latch count circuit for counting pieces of the read data fetched to the read buffer; and
- a comparison circuit for comparing the counted number of the latch count circuit with a predetermined reference value, and generating a latch completion signal when the counted number reaches the predetermined reference value, the read timing control circuit determines that said at least one latch timing control circuit provided in the semiconductor integrated circuit has outputted the latch completion signal, and transfers the read data from said at least one read buffer provided in the semiconductor integrated circuit after the determination.

5. The semiconductor integrated circuit of claim 3, wherein:
said at least one DDR-SDARM comprises a plurality of DDR-SDRAMs,
said at least one read buffer comprises a plurality of read buffers,
said at least one latch timing control circuit comprises a plurality of latch timing control circuit,
each of the plurality of read buffers is coupled to a corresponding one of the plurality of DDR-SDRAMs, and
each of the plurality of latch timing control circuits is coupled to a corresponding one of the plurality of data strobe signals and a corresponding one of the plurality of DDR-SDRAMs.

6. The semiconductor integrated circuit of claim 4, wherein:
said at least one DDR-SDARM comprises a plurality of DDR-SDRAMs,
said at least one read buffer comprises a plurality of read buffers,
said at least one latch timing control circuit comprises a plurality of latch timing control circuit,
each of the plurality of read buffers is coupled to a corresponding one of the plurality of DDR-SDRAMs, and
each of the plurality of latch timing control circuits is coupled to a corresponding one of the plurality of data strobe signals and a corresponding one of the plurality of DDR-SDRAMs.

* * * * *